United States Patent
Hirata

(10) Patent No.: US 10,155,323 B2
(45) Date of Patent: Dec. 18, 2018

(54) SIC WAFER PRODUCING METHOD

(71) Applicant: DISCO CORPORATION, Tokyo (JP)

(72) Inventor: Kazuya Hirata, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/833,556

(22) Filed: Dec. 6, 2017

(65) Prior Publication Data

US 2018/0154543 A1    Jun. 7, 2018

(30) Foreign Application Priority Data

Dec. 6, 2016  (JP) .................................. 2016-236701

(51) Int. Cl.
| | |
|---|---|
| B23K 26/08 | (2014.01) |
| B28D 5/00 | (2006.01) |
| H01L 21/02 | (2006.01) |
| H01L 31/00 | (2006.01) |
| B23K 26/00 | (2014.01) |
| B26F 3/00 | (2006.01) |
| B26D 7/08 | (2006.01) |
| H01L 29/16 | (2006.01) |

(52) U.S. Cl.
CPC .............. B26F 3/002 (2013.01); B26D 7/086 (2013.01); H01L 29/1608 (2013.01)

(58) Field of Classification Search
CPC . H01L 21/02; H01L 21/0201; H01L 21/0506; H01L 31/0504; H01L 31/02008; H01L 31/03926; B23K 26/057; B23K 26/0622; B23K 26/53; B23K 26/0006
See application file for complete search history.

(56) References Cited

U.S. PATENT DOCUMENTS

| | | | | |
|---|---|---|---|---|
| 9,620,415 B2* | 4/2017 | Hirata | ..................... | H01L 21/78 |
| 9,789,565 B2* | 10/2017 | Hirata | ................ | B23K 26/0057 |
| 9,899,262 B2* | 2/2018 | Hirata | ..................... | H01L 21/78 |
| 2003/0141505 A1* | 7/2003 | Isobe | ..................... | H01L 27/12 |
| | | | | 257/66 |
| 2009/0320897 A1* | 12/2009 | Shimomura | ............ | H01L 31/05 |
| | | | | 136/244 |

(Continued)

FOREIGN PATENT DOCUMENTS

| | | |
|---|---|---|
| JP | 2000-094221 | 4/2000 |
| JP | 2016-111143 | 6/2016 |

*Primary Examiner* — Seahvosh Nikmanesh
(74) *Attorney, Agent, or Firm* — Greer Burns & Crain Ltd.

(57) ABSTRACT

A SiC wafer producing method produces an SiC wafer from a single crystal SiC ingot. The method includes a separation layer forming step of setting a focal point of a pulsed laser beam having a transmission wavelength to single crystal SiC inside the ingot at a predetermined depth from an end surface of the ingot, the predetermined depth corresponding to the thickness of the wafer to be produced, and next applying the pulsed laser beam to the ingot, thereby forming a plurality of modified portions on a c-plane present in the ingot at the predetermined depth and also forming cracks isotropically on the c-plane so as to extend from each modified portion, each modified portion being a region where SiC has been decomposed into Si and C, the modified portions and the cracks constituting a separation layer along which the wafer is to be separated from the ingot.

6 Claims, 7 Drawing Sheets

(56) References Cited

U.S. PATENT DOCUMENTS

| | | | |
|---|---|---|---|
| 2012/0055546 A1* | 3/2012 | Turner | B23K 26/073 |
| | | | 136/256 |
| 2012/0111495 A1* | 5/2012 | Shimoi | B23K 26/0057 |
| | | | 156/250 |
| 2016/0052090 A1* | 2/2016 | Tanigawa | B23K 26/0624 |
| | | | 219/121.69 |
| 2016/0093763 A1* | 3/2016 | Rana | B23K 26/0084 |
| | | | 438/57 |
| 2017/0053829 A1* | 2/2017 | Hirata | H01L 21/78 |

* cited by examiner

SIC WAFER PRODUCING METHOD

BACKGROUND OF THE INVENTION

Field of the Invention

The present invention relates to an SiC wafer producing method for producing an SiC wafer from a single crystal SiC ingot.

Description of the Related Art

Various devices such as ICs (integrated circuits), LSIs (large scale integrations), and LEDs (light emitting diodes) are formed by forming a functional layer on the front side of a wafer formed of Si (silicon) or $Al_2O_3$ (sapphire) and partitioning this functional layer into a plurality of separate regions along a plurality of division lines. Further, power devices or optical devices such as LEDs are formed by forming a functional layer on the front side of a wafer formed of single crystal SiC (silicon carbide) and partitioning this functional layer into a plurality of separate regions along a plurality of division lines. The division lines of such a wafer having these devices are processed by a processing apparatus such as a cutting apparatus and a laser processing apparatus to thereby divide the wafer into a plurality of individual device chips respectively corresponding to the devices. The device chips thus obtained are used in various electrical equipment such as mobile phones and personal computers.

In general, the wafer on which the devices are to be formed is produced by slicing a cylindrical ingot with a wire saw. Both sides of the wafer sliced from the ingot are polished to a mirror finish (see Japanese Patent Laid-open No. 2000-94221). However, when the ingot is cut by the wire saw and both sides of each wafer are polished to obtain the product, a large proportion (70% to 80%) of the ingot is discarded to cause a problem of poor economy. In particular, a single crystal SiC ingot has high hardness and it is therefore difficult to cut this ingot with the wire saw. Accordingly, considerable time is required for cutting of the ingot, causing a reduction in productivity. Furthermore, since this ingot is high in unit price, there is a problem in efficiently producing a wafer in this prior art.

A technique for solving this problem has been proposed by the present applicant (see Japanese Patent Laid-open No. 2016-111143). This technique includes the steps of setting the focal point of a laser beam having a transmission wavelength to SiC inside an SiC ingot, next applying the laser beam to the SiC ingot as scanning the laser beam on the ingot to thereby form a separation layer in a separation plane previously set inside the ingot, and next separating an SiC wafer from the SiC ingot along the separation layer.

SUMMARY OF THE INVENTION

However, the method described in Japanese Patent Laid-open No. 2016-111143 has a problem such that it is difficult to separate the SiC wafer from the SiC ingot along the separation layer, causing a reduction in production efficiency.

It is therefore an object of the present invention to provide an SiC wafer producing method which can efficiently separate an SiC wafer from a single crystal SiC ingot.

In accordance with an aspect of the present invention, there is provided an SiC wafer producing method for producing an SiC wafer from a single crystal SiC ingot having an end surface, a c-axis intersecting the end surface, and a c-plane perpendicular to the c-axis, the SiC wafer producing method including a separation layer forming step of setting a focal point of a pulsed laser beam having a transmission wavelength to single crystal SiC inside the SiC ingot at a predetermined depth from the end surface, the predetermined depth corresponding to the thickness of the SiC wafer to be produced, and next applying the pulsed laser beam to the SiC ingot, thereby forming a plurality of modified portions on the c-plane at the predetermined depth and also forming a plurality of cracks isotropically formed on the c-plane so as to extend from each modified portion, each modified portion being a region where SiC has been decomposed into Si and C, the modified portions and the cracks constituting a separation layer along which the SiC wafer is to be separated from the SiC ingot; and a wafer producing step of separating a part of the SiC ingot along the separation layer as an interface, thereby producing the SiC wafer; the wafer producing step including the steps of immersing the SiC ingot in a liquid and next applying ultrasonic wave through the liquid to the SiC ingot, the ultrasonic wave having a frequency greater than or equal to a critical frequency close to the natural frequency of the SiC ingot.

Preferably, the critical frequency close to the natural frequency of the SiC ingot is 0.8 times the natural frequency of the SiC ingot. Preferably, the liquid is water, the temperature of the water being set to a temperature at which the occurrence of cavitation is suppressed. Preferably, the temperature of the water is in the range of 0° C. to 25° C.

Preferably, the c-axis coincides with a normal to the end surface of the SiC ingot; the separation layer forming step including a modified portion forming step of applying the pulsed laser beam to the SiC ingot in the condition where the focal point is set at the predetermined depth as relatively feeding the SiC ingot and the focal point in a feeding direction, thereby continuously forming the modified portions so that any adjacent ones of the modified portions overlap each other in the feeding direction; and an indexing step of relatively indexing the SiC ingot and the focal point in an indexing direction in the range not greater than the width of the cracks; the modified portion forming step and the indexing step being alternately performed to form the separation layer, in which the cracks adjacent to each other in the indexing direction are connected.

In another case, the c-axis is inclined by an off angle with respect to a normal to the end surface of the SiC ingot; the separation layer forming step including a modified portion forming step of applying the pulsed laser beam to the SiC ingot in the condition where the focal point is set at the predetermined depth as relatively feeding the SiC ingot and the focal point in a first direction perpendicular to a second direction where the off angle is formed between the c-plane and the end surface, thereby continuously forming the modified portions so that any adjacent ones of the modified portions overlap each other in the first direction; and an indexing step of relatively indexing the SiC ingot and the focal point in the second direction in the range not greater than the width of the cracks; the modified portion forming step and the indexing step being alternately performed to form the separation layer, in which the cracks adjacent to each other in the indexing direction are connected.

According to the SiC wafer producing method of the present invention, the SiC wafer can be efficiently separated from the SiC ingot, so that the productivity can be improved.

The above and other objects, features and advantages of the present invention and the manner of realizing them will become more apparent, and the invention itself will best be

DETAILED DESCRIPTION OF THE PREFERRED EMBODIMENT

The SiC wafer producing method of the present invention is applicable regardless of whether or not the c-axis in a single crystal SiC ingot is inclined with respect to a normal to an end surface of the single crystal SiC ingot. In the case that the c-axis is not inclined with respect to the normal to the end surface, i.e., in the case that the c-axis coincides with the normal to the end surface, there will now be described a first preferred embodiment of the SiC wafer producing method of the present invention with reference to FIGS. 1 to 6B.

Figure 1:
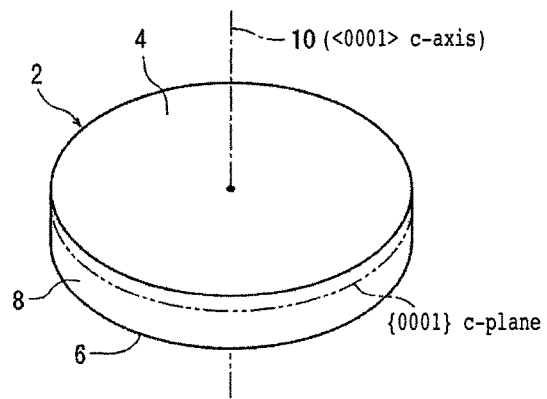
FIG. 1 is a perspective view of a single crystal SiC ingot having a c-axis coinciding with a normal to an end surface of the SiC ingot according to a first preferred embodiment of the present invention.

FIG. 1 depicts a cylindrical hexagonal single crystal SiC ingot 2 (which will be hereinafter referred to simply as "ingot 2") as a workpiece to be processed. The ingot 2 has a circular first surface 4 (end surface), a circular second surface 6 opposite to the first surface 4, a cylindrical surface 8 formed so as to connect the first surface 4 and the second surface 6, a c-axis (<0001> direction) extending from the first surface 4 to the second surface 6, and a c-plane ({0001} plane) perpendicular to the c-axis. In the ingot 2, the c-axis is not inclined with respect to a normal 10 to the first surface 4. That is, the c-axis coincides with the normal 10.

Figure 2A:
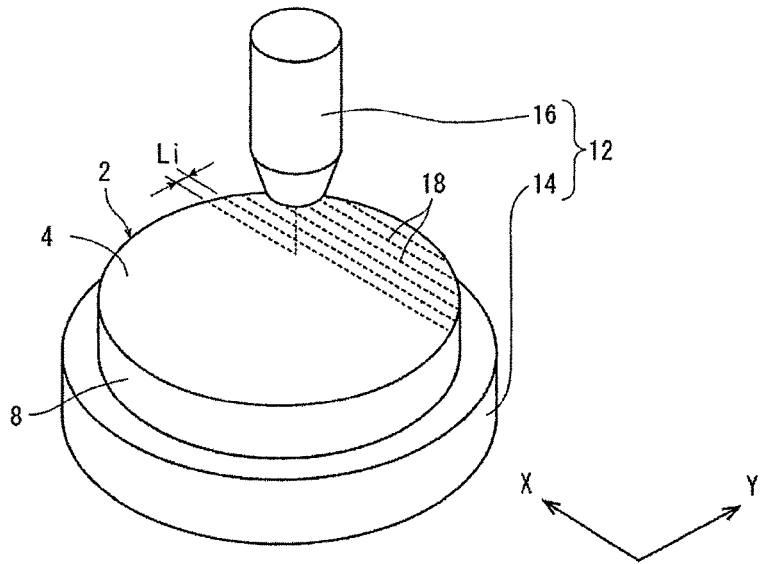
FIG. 2A is a perspective view depicting a separation layer forming step of forming a separation layer in the SiC ingot depicted in FIG. 1.
Figure 2B:
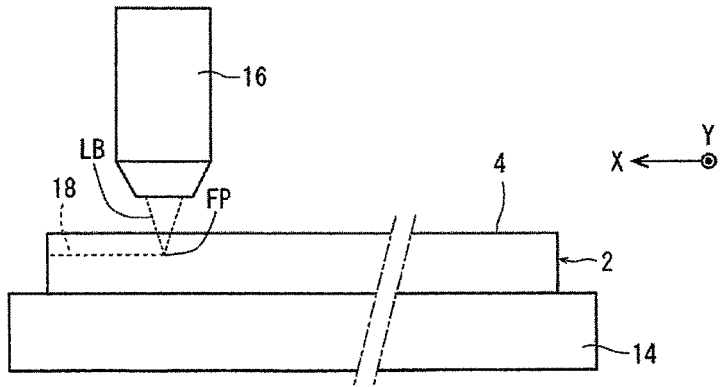
FIG. 2B is an elevational view of FIG. 2A.

In this preferred embodiment, a separation layer forming step is first performed to form a separation layer on the c-plane at a predetermined depth from the first surface 4, this predetermined depth corresponding to the thickness of a wafer to be produced, and the separation layer is composed of a plurality of continuous modified portions where SiC has been decomposed into Si and C and a plurality of cracks isotropically formed on the c-plane so as to extend from each modified portion. This separation layer forming step may be performed by using a laser processing apparatus 12, a part of which is depicted in FIGS. 2A and 2B. The laser processing apparatus 12 includes a chuck table 14 and focusing means 16. The chuck table 14 is rotatable about its axis extending in a vertical direction by rotating means (not depicted). The chuck table 14 is movable in an X direction by X moving means (not depicted) and also movable in a Y direction by Y moving means (not depicted). All of the rotating means, the X moving means, and the Y moving means are included in the laser processing apparatus 12. The focusing means 16 includes a focusing lens (not depicted) for focusing a pulsed laser beam LB and applying it to a workpiece. The pulsed laser beam LB is oscillated from a laser oscillator (not depicted) included in the laser processing apparatus 12 and transmitted to the focusing means 16. The X direction is defined as the direction depicted by an arrow X in FIG. 2A, and the Y direction is defined as the direction depicted by an arrow Y in FIG. 2A, which is perpendicular to the X direction in an XY plane. The XY plane defined by the X direction and the Y direction is a substantially horizontal plane.

In the separation layer forming step, the ingot 2 is first fixed to the chuck table 14 in the condition where an adhesive (e.g., epoxy resin adhesive) is interposed between the second surface 6 of the ingot 2 and the upper surface of the chuck table 14. As a modification, the upper surface of the chuck table 14 may be formed with a plurality of suction holes, whereby a suction force may be produced on the upper surface of the chuck table 14 to thereby hold the ingot 2 under suction. Thereafter, imaging means (not depicted) included in the laser processing apparatus 12 is operated to image the ingot 2 from the upper side of the first surface 4. Thereafter, the X moving means and the Y moving means of the laser processing apparatus 12 are operated to move the chuck table 14 according to the image of the ingot 2 detected by the imaging means, thereby adjusting the positional relation between the ingot 2 and the focusing means 16 in the XY plane. Thereafter, focal position adjusting means (not depicted) included in the laser processing apparatus 12 is operated to vertically move the focusing means 16, thereby setting a focal point FP at a predetermined depth from the first surface 4, this predetermined depth corresponding to the thickness of a wafer to be produced. Thereafter, a pulsed laser beam LB having a transmission wavelength to single crystal SiC is applied from the focusing means 16 to the ingot 2 as relatively moving the ingot 2 and the focal point FP (modified portion forming step).

Figure 3:
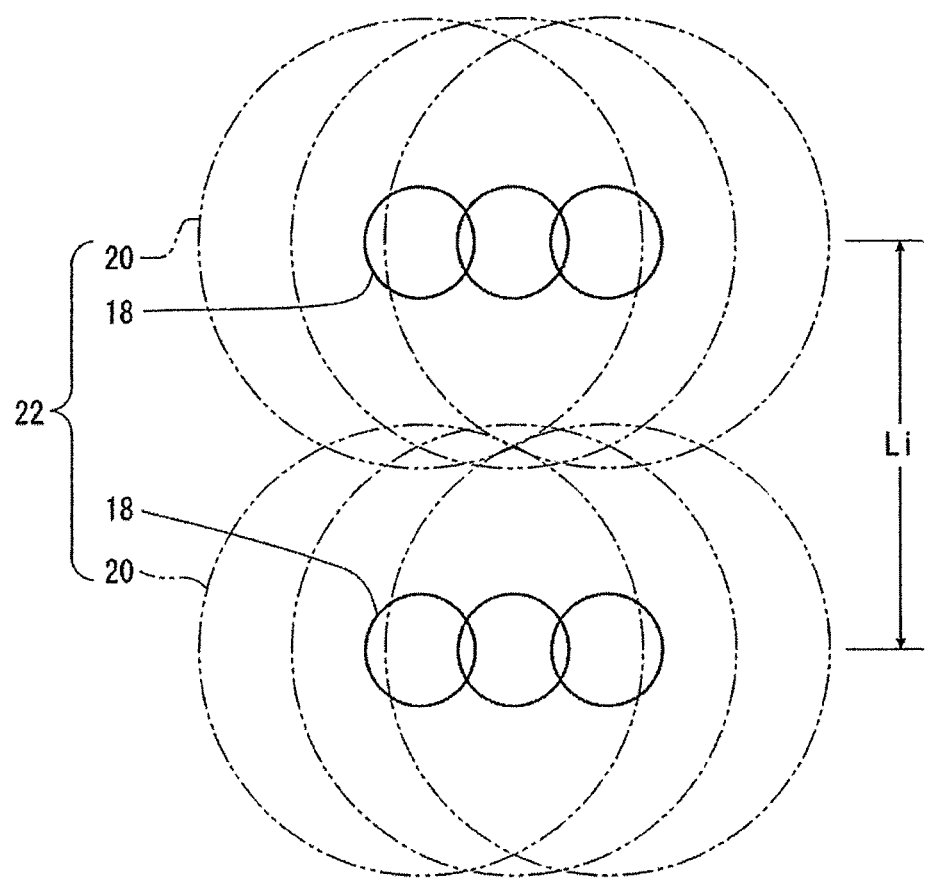
FIG. 3 is a schematic plan view depicting modified portions and cracks constituting the separation layer.
Figure 4:
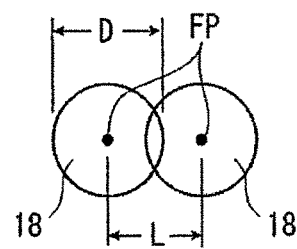
FIG. 4 is a schematic plan view of the adjacent modified portions continuously formed.

In this preferred embodiment, the modified portion forming step is performed in the following manner as depicted in FIGS. 2A and 2B. The X moving means is operated to move the chuck table 14 relative to the focal point FP in the X direction at a predetermined feed speed without moving the focal point FP. At the same time, the pulsed laser beam LB is applied from the focusing means 16 to the ingot 2. As a result, a plurality of modified portions 18 can be formed continuously on the same c-plane at a predetermined depth from the first surface 4 so as to linearly extend in the X direction, this predetermined depth corresponding to the thickness of a wafer to be produced. At the same time, as depicted in FIG. 3, a plurality of cracks can be formed so as to extend isotropically from each modified portion 18 along the same c-plane. Each modified portion 18 is a small circular region where SiC has been decomposed into Si and C by the application of the pulsed laser beam LB. In FIG. 3, the cracks extending isotropically from each modified portion 18 are represented by a circular area 20 depicted by a phantom line. Referring to FIG. 4, D denotes the diameter of each modified portion 18 and L denotes the spacing between the adjacent focal points FP spaced in the feeding direction (X direction), in which the cracks 20 are formed isotropically from each modified portion 18 on the same c-plane in a region where the relation of D>L is satisfied (i.e., the adjacent modified portions 18 arranged in the feeding direction, or in the X direction are overlapped). The spacing L between the adjacent focal points FP spaced in the feeding direction is defined by the relative speed V between the focal point FP and the chuck table 14 and the repetition frequency F of the pulsed laser beam LB (L=V/F). In this preferred embodiment, the relation of D>L can be satisfied by adjusting the feed speed V of the chuck table 14 in the X direction relative to the focal point FP and the repetition frequency F of the pulsed laser beam LB.

After performing the modified portion forming step along a line in the X direction, the chuck table 14 is moved relative to the focal point FP in the Y direction by a predetermined index amount Li by operating the Y moving means in the range not greater than the width of the cracks 20 (i.e., the diameter of the circular area 20 in FIG. 3) (indexing step). Thereafter, the modified portion forming step and the indexing step are alternately performed plural times, so that a plurality of linear modified layers extending in the X direction are formed so as to be spaced by the index amount Li in the Y direction, each linear modified layer being composed of the plural modified portions 18 overlapped in the X direction. Furthermore, the cracks 20 adjacent to each other in the Y direction can be connected. Accordingly, a separation layer 22 composed of the plural modified portions 18 and the plural cracks 20 can be formed on the same c-plane at the predetermined depth from the first surface 4, which depth corresponds to the thickness of a wafer to be produced.

Figure 5:
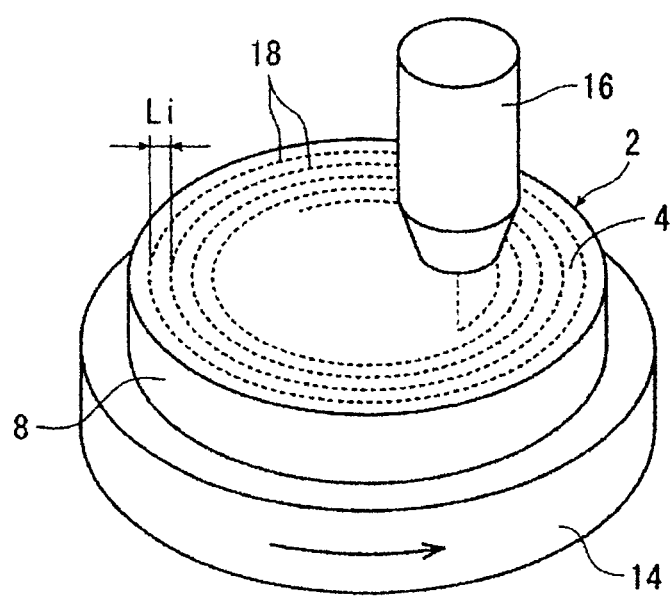
FIG. 5 is a perspective view depicting a modification of the separation layer forming step, in which the modified portions are formed continuously along the circumference of the SiC ingot.
Figure 6A:
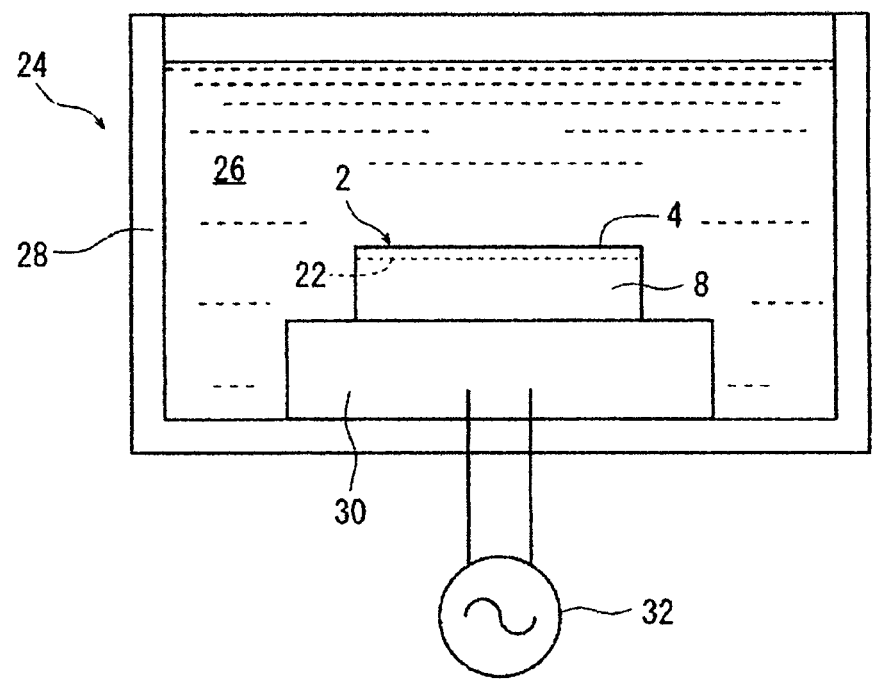
FIG. 6A is an elevational view depicting a wafer producing step.
Figure 6B:
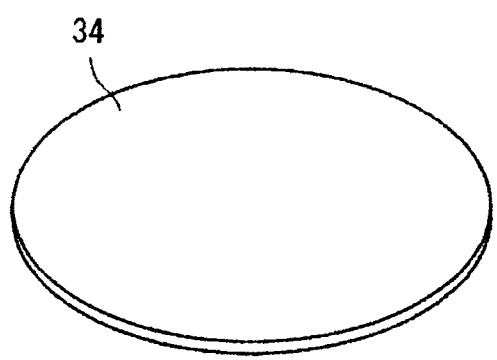
FIG. 6B is a perspective view of an SiC wafer produced by performing the wafer producing step depicted in FIG. 6A.

As described above, the modified portion forming step in the separation layer forming step may be performed by relatively moving the focal point FP and the chuck table 14. Accordingly, as a modification, the modified portion forming step may be performed by rotating the chuck table 14 as depicted in FIG. 5. More specifically, the rotating means (not depicted) is operated to rotate the chuck table 14 at a predetermined speed relative to the focal point FP fixed in the counterclockwise direction (or in the clockwise direction) as viewed in plan. At the same time, the pulsed laser beam LB having a transmission wavelength to single crystal SiC is applied from the focusing means 16 to the ingot 2. As a result, a plurality of modified portions 18 are continuously formed on the same c-plane at the predetermined depth from the first surface 4, which depth corresponds to the thickness of a wafer to be produced, in such a manner that an annular modified layer is formed by these plural modified portions 18 along the circumference of the ingot 2. At the same time, a plurality of cracks 20 can be formed so as to extend isotropically from each modified portion 18. As described above, the cracks 20 are formed isotropically from each modified portion 18 along the same c-plane in the region where the relation of D>L is satisfied, in which D denotes the diameter of each modified portion 18 and L denotes the spacing between the adjacent focal points FP spaced in the feeding direction. Further, the spacing L is defined by the relative speed V between the focal point FP and the chuck table 14 and the repetition frequency F of the pulsed laser beam LB (L=V/F). In the case depicted in FIG. 5, the relation of D>L can be satisfied by adjusting the peripheral speed V of the chuck table 14 relative to the focal point FP at the position of the focal point FP and the repetition frequency F of the pulsed laser beam LB.

In the case depicted in FIG. 5 where the modified portion forming step is performed by rotating the chuck table 14, the indexing step is next performed by operating the X moving means or the Y moving means to move the chuck table 14 relative to the focal point FP in the radial direction of the ingot 2 by the predetermined index amount Li in the range not greater than the width of the cracks 20. Thereafter, the modified portion forming step and the indexing step are alternately performed plural times, so that a plurality of annular modified layers extending along the circumference of the ingot 2 are formed concentrically so as to be spaced by the index amount Li in the radial direction of the ingot 2, each annular modified layer being composed of the plural modified portions 18 overlapped in the circumferential direction of the ingot 2. Further, the cracks 20 adjacent to each other in the radial direction of the ingot 2 can be connected. Accordingly, a similar separation layer 22 composed of the plural modified portions 18 and the plural cracks 20 can be formed on the same c-plane at the predetermined depth from the first surface 4, which depth corresponds to the thickness of a wafer to be produced.

After performing the separation layer forming step, a wafer producing step is performed to separate a part of the ingot 2 along the separation layer 22 as an interface, thereby producing a wafer. The wafer producing step may be performed by using a separating apparatus 24 depicted in FIG. 6A. The separating apparatus 24 includes a liquid bath 28 for storing a liquid 26, an ultrasonic vibrator 30 located in the liquid bath 28, and ultrasonic vibration applying means 32 for applying ultrasonic vibration to the ultrasonic vibrator 30.

In the wafer producing step, the ingot 2 in which the separation layer 22 has been formed is first put into the liquid bath 28 so as to be immersed in the liquid 26 stored in the liquid bath 28 and is then placed on the upper surface of the ultrasonic vibrator 30. Thereafter, ultrasonic vibration having a frequency greater than or equal to a critical frequency close to the natural frequency of the ingot 2 is applied from the ultrasonic vibration applying means 32 to the ultrasonic vibrator 30. As a result, ultrasonic wave having a frequency greater than or equal to the critical frequency close to the natural frequency of the ingot 2 is applied from the ultrasonic vibrator 30 through the liquid 26 to the ingot 2. Accordingly, a part of the ingot 2 can be efficiently separated along the separation layer 22 as an interface to thereby produce a wafer 34 depicted in FIG. 6B. Accordingly, the productivity can be improved.

The above-mentioned critical frequency close to the natural frequency of the ingot 2 is defined in the following manner. In applying ultrasonic wave from the ultrasonic vibrator 30 through the liquid 26 to the ingot 2 immersed in the liquid 26 to thereby separate a part of the ingot 2 along the separation layer 22 as an interface, the frequency of the ultrasonic wave is gradually increased from a frequency lower than the natural frequency of the ingot 2 by a predetermined amount. When the frequency of the ultrasonic wave has reached a certain frequency, a part of the ingot 2 starts to be separated along the separation layer 22 as an interface at this certain frequency. This certain frequency is defined as the critical frequency close to the natural frequency of the ingot 2. That is, the critical frequency close to the natural frequency of the ingot 2 is lower than the natural frequency of the ingot 2. Preferably, the critical frequency close to the natural frequency of the ingot 2 is approximately 0.8 times the natural frequency of the ingot 2. The liquid 26 stored in the liquid bath 28 is preferably water, and the temperature of the water is preferably set to a temperature at which the occurrence of cavitation can be suppressed in applying ultrasonic vibration from the ultrasonic vibration applying means 32 to the ultrasonic vibrator 30. More specifically, the temperature of the water is preferably set to 0° C. to 25° C. In this condition, there is no possibility that the energy of the ultrasonic wave may be converted into cavitation, so that the energy of the ultrasonic wave can be effectively applied to the ingot 2.

In the case that the c-axis in a single crystal SiC ingot is inclined with respect to the normal to the end surface, there will now be described a second preferred embodiment of the SiC wafer producing method of the present invention with reference to FIGS. 7A to 9B.

Figure 7A:
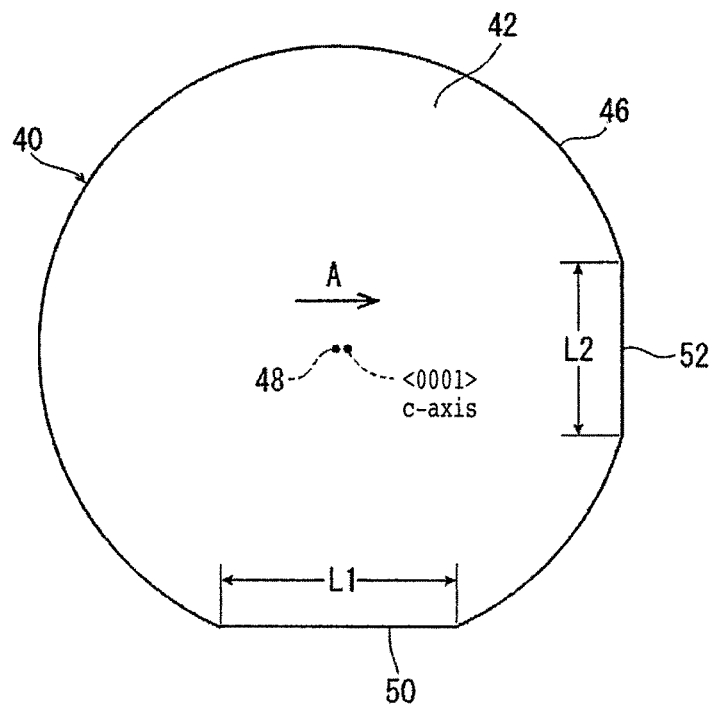
FIG. 7A is a plan view of a single crystal SiC ingot having a c-axis inclined with respect to a normal to an end surface of the SiC ingot according to a second preferred embodiment of the present invention.
Figure 7B:
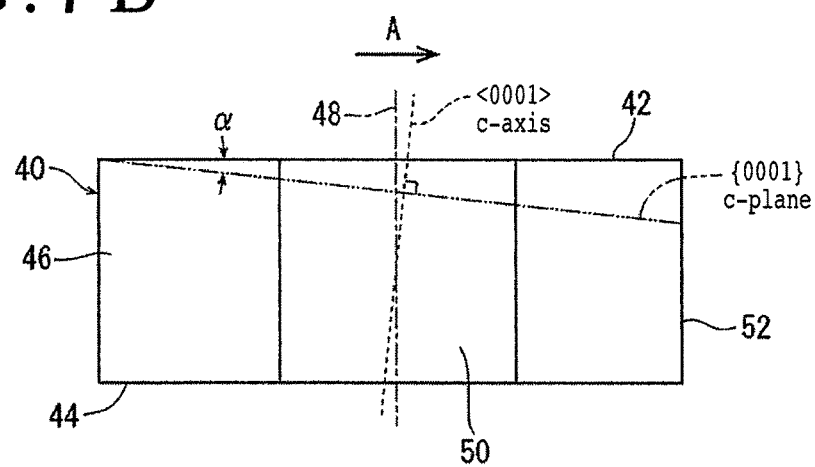
FIG. 7B is an elevational view of FIG. 7A.

FIGS. 7A and 7B depict a generally cylindrical hexagonal single crystal SiC ingot 40 (which will be hereinafter referred to simply as "ingot 40") as a workpiece to be processed. The ingot 40 has a substantially circular first surface 42 (end surface), a substantially circular second surface 44 opposite to the first surface 42, a substantially cylindrical surface 46 formed so as to connect the first surface 42 and the second surface 44, a c-axis (<0001> direction) extending from the first surface 42 to the second surface 44, and a c-plane ({0001} plane) perpendicular to the c-axis. In the ingot 40, the c-axis is inclined by an off angle α with respect to a normal 48 to the first surface 42. The off angle α (e.g., α=4 degrees) is formed between the c-plane and the first surface 42 (the direction of formation of the off angle α is depicted by an arrow A in FIGS. 7A and 7B). Further, the cylindrical surface 46 of the ingot 40 is formed with a first orientation flat 50 and a second orientation flat 52, which are rectangular in side elevation and function to indicate crystal orientation. The first orientation flat 50 is parallel to the direction A of formation of the off angle α, and the second orientation flat 52 is perpendicular to the direction A of formation of the off angle α. As depicted in FIG. 7A, which is a plan view taken in the direction of extension of the normal 48, the length L2 of the second orientation flat 52 is set shorter than the length L1 of the first orientation flat 50 (L2<L1).

Figure 8A:
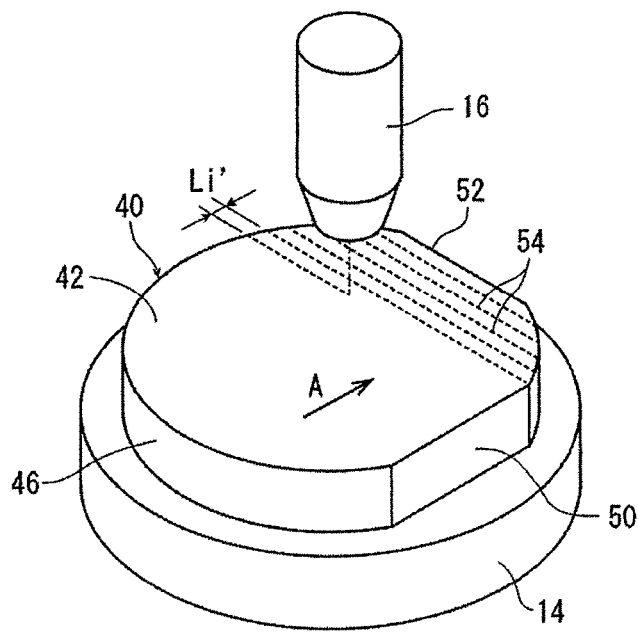
FIG. 8A is a perspective view depicting a separation layer forming step of forming a separation layer in the SiC ingot depicted in FIGS. 7A and 7B.

In this preferred embodiment, a separation layer forming step is first performed to form a separation layer on the c-plane at a predetermined depth from the first surface 42, this predetermined depth corresponding to the thickness of a wafer to be produced, and the separation layer is composed of a plurality of continuous modified portions where SiC has been decomposed into Si and C and a plurality of cracks isotropically formed on the c-plane so as to extend from each modified portion. This separation layer forming step may be performed by using the laser processing apparatus 12 mentioned above. In the separation layer forming step, the ingot 40 is first fixed to the chuck table 14 in the condition where an adhesive (e.g., epoxy resin adhesive) is interposed between the second surface 44 of the ingot 40 and the upper surface of the chuck table 14. As a modification, the upper surface of the chuck table 14 may be formed with a plurality of suction holes, whereby a suction force may be produced on the upper surface of the chuck table 14 to thereby hold the ingot 40 under suction. Thereafter, the imaging means of the laser processing apparatus 12 is operated to image the ingot 40 from the upper side of the first surface 42. Thereafter, the X moving means, the Y moving means, and the rotating means of the laser processing apparatus 12 are operated to move and rotate the chuck table 14 according to the image of the ingot 40 detected by the imaging means, thereby adjusting the orientation of the ingot 40 to a predetermined orientation and also adjusting the positional relation between the ingot 40 and the focusing means 16 in the XY plane. In adjusting the orientation of the ingot 40 to a predetermined orientation, the first orientation flat 50 is made parallel to the Y direction and the second orientation flat 52 is made parallel to the X direction as depicted in FIG. 8A. Accordingly, the direction A of formation of the off angle α is made parallel to the Y direction, and the direction perpendicular to the direction A of formation of the off angle α is made parallel to the X direction.

Figure 8B:
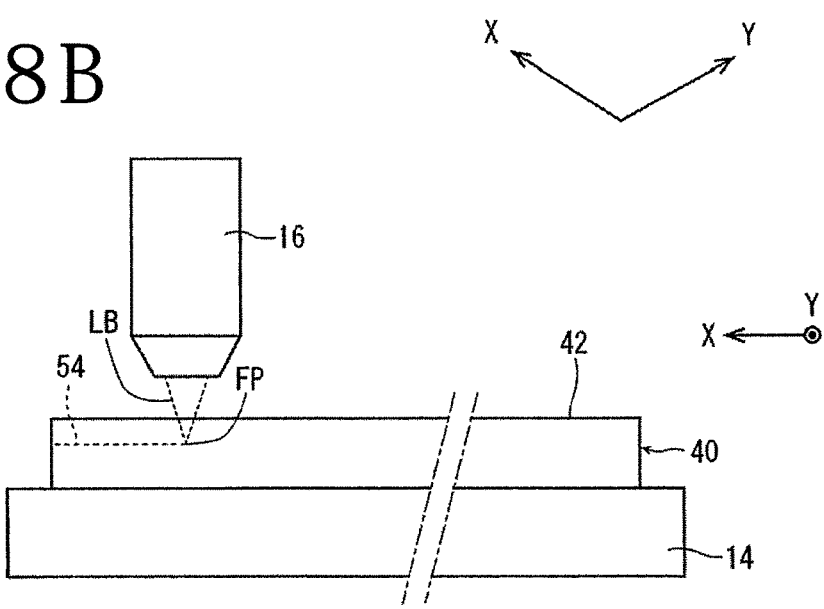
FIG. 8B is an elevational view of FIG. 8A.
Figure 9A:
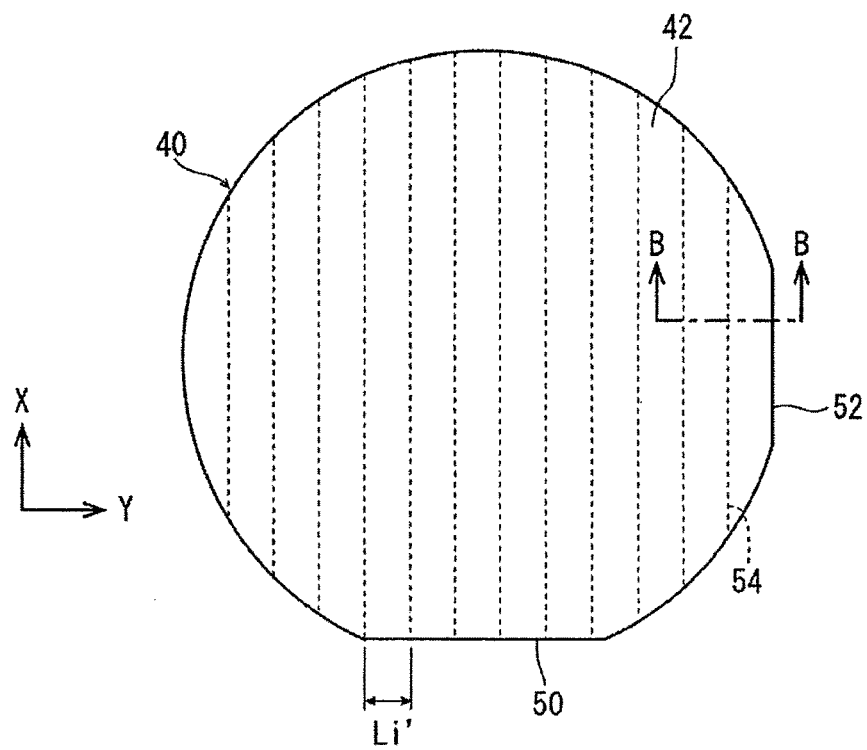
FIG. 9A is a plan view of the SiC ingot processed by the separation layer forming step depicted in FIGS. 8A and 8B.
Figure 9B:
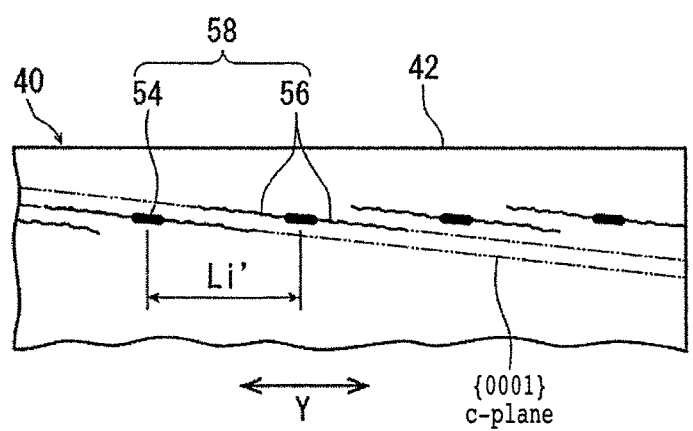
FIG. 9B is a cross section taken along the line B-B in FIG. 9A.

Thereafter, the focal position adjusting means of the laser processing apparatus 12 is operated to vertically move the focusing means 16, thereby setting a focal point FP at a predetermined depth from the first surface 42, this predetermined depth corresponding to the thickness of a wafer to be produced. Thereafter, a pulsed laser beam LB having a transmission wavelength to single crystal SiC is applied from the focusing means 16 to the ingot 40 as relatively moving the ingot 40 and the focal point FP in the X direction (i.e., in the direction perpendicular to the direction A of formation of the off angle α) (modified portion forming step). In this preferred embodiment, the modified portion forming step is performed in the following manner as depicted in FIGS. 8A and 8B. The X moving means is operated to move the chuck table 14 relative to the focal point FP in the X direction (i.e., in the direction perpendicular to the direction A of formation of the off angle α) at a predetermined feed speed without moving the focal point FP. At the same time, the pulsed laser beam LB is applied from the focusing means 16 to the ingot 40. As a result, a plurality of modified portions 54 can be formed continuously on the same c-plane at a predetermined depth from the first surface 42 so as to linearly extend in the X direction (i.e., in the direction perpendicular to the direction A of formation of the off angle α), this predetermined depth corresponding to the thickness of a wafer to be produced. At the same time, as depicted in FIG. 9B, a plurality of cracks 56 can be formed so as to extend isotropically from each modified portion 54 along the same c-plane. Each modified portion 54 is a small circular region where SiC has been decomposed into Si and C by the application of the pulsed laser beam LB. Further, the cracks 56 extending isotropically from each modified portion 54 are formed as a circular area as in FIG. 3. As described above, letting D denote the diameter of each modified portion 54 and L denote the spacing between the adjacent focal points FP spaced in the feeding direction (X direction), the cracks 56 are formed isotropically from each modified portion 54 on the same c-plane in a region where the relation of D>L is satisfied. The spacing L between the adjacent focal points FP spaced in the feeding direction is defined by the relative speed V between the focal point FP and the chuck table 14 and the repetition frequency F of the pulsed laser beam LB (L=V/F). In this preferred embodiment, the relation of D>L can be satisfied by adjusting the feed speed V of the chuck table 14 in the X direction relative to the focal point FP and the repetition frequency F of the pulsed laser beam LB.

After performing the modified portion forming step along a line in the X direction, the chuck table 14 is moved relative to the focal point FP in the Y direction (i.e., in the direction A of formation of the off angle α) by a predetermined index amount Li' by operating the Y moving means in the range not greater than the width of the cracks 56 (indexing step). Thereafter, the modified portion forming step and the indexing step are alternately performed plural times, so that a plurality of linear modified layers extending in the X direction (i.e., in the direction perpendicular to the direction A of formation of the off angle α) are formed so as to be spaced by the index amount Li' in the Y direction (i.e., in the direction A of formation of the off angle α), each linear modified layer being composed of the plural modified portions 54 overlapped in the X direction. Furthermore, the cracks 56 adjacent to each other in the Y direction can be connected. Accordingly, a separation layer 58 composed of the plural modified portions 54 and the plural cracks 56 can be formed at the predetermined depth from the first surface 42, which depth corresponds to the thickness of a wafer to be produced.

After performing the separation layer forming step, a wafer producing step is performed to separate a part of the ingot 40 along the separation layer 58 as an interface, thereby producing a wafer. The wafer producing step may be performed by using the separating apparatus 24 mentioned above. In the wafer producing step, the ingot 40 in which the separation layer 58 has been formed is first put into the liquid bath 28 so as to be immersed in the liquid 26 stored in the liquid bath 28 and is then placed on the upper surface of the ultrasonic vibrator 30. Thereafter, ultrasonic vibration having a frequency greater than or equal to a critical frequency close to the natural frequency of the ingot 40 is applied from the ultrasonic vibration applying means 32 to the ultrasonic vibrator 30. As a result, ultrasonic wave having a frequency greater than or equal to the critical frequency close to the natural frequency of the ingot 40 is applied from the ultrasonic vibrator 30 through the liquid 26 to the ingot 40. Accordingly, a part of the ingot 40 can be efficiently separated along the separation layer 58 as an interface to thereby produce a wafer. Accordingly, the productivity can be improved.

The above-mentioned critical frequency close to the natural frequency of the ingot 40 is defined in the following manner. In applying ultrasonic wave from the ultrasonic vibrator 30 through the liquid 26 to the ingot 40 immersed in the liquid 26 to thereby separate a part of the ingot 40 along the separation layer 58 as an interface, the frequency of the ultrasonic wave is gradually increased from a frequency lower than the natural frequency of the ingot 40 by a predetermined amount. When the frequency of the ultrasonic wave has reached a certain frequency, a part of the ingot 40 starts to be separated along the separation layer 58 as an interface at this certain frequency. This certain frequency is defined as the critical frequency close to the natural frequency of the ingot 40. That is, the critical frequency close to the natural frequency of the ingot 40 is lower than the natural frequency of the ingot 40. Preferably, the critical frequency close to the natural frequency of the ingot 40 is approximately 0.8 times the natural frequency of the ingot 40. The liquid 26 stored in the liquid bath 28 is preferably water, and the temperature of the water is preferably set to a temperature at which the occurrence of cavitation can be suppressed in applying ultrasonic vibration from the ultrasonic vibration applying means 32 to the ultrasonic vibrator 30. More specifically, the temperature of the water is preferably set to 0° C. to 25° C. In this condition, there is no possibility that the energy of the ultrasonic wave may be converted into cavitation, so that the energy of the ultrasonic wave can be effectively applied to the ingot 40.

The present inventor performed a test on the critical frequency close to the natural frequency of the single crystal SiC ingot and on the temperature of the liquid stored in the liquid bath in the separating apparatus. The test was performed under the following laser processing conditions.

(Laser Processing Conditions)
Wavelength of the pulsed laser beam: 1064 nm
Repetition frequency F: 60 kHz
Average power: 1.5 W
Pulse width: 4 ns
Spot diameter: 3 μm
Numerical aperture (NA) of the focusing lens: 0.65
Feed speed V: 200 mm/second (Test 1) Formation of a Proper Separation Layer A single crystal SiC ingot having a thickness of 3 mm was used for the test. The focal point of the pulsed laser beam was set in the ingot at a depth of 100 μm from the end surface of the ingot. Then, the pulsed laser beam was applied to the ingot to thereby form a plurality of continuous modified portions each having a diameter of 17 μm, in which SiC has been decomposed into Si and C. These continuous modified portions were overlapped in the feeding direction at an overlap rate R of 80%. That is, the overlap rate R between any adjacent ones of the plural modified portions continuously formed in the feeding direction was 80%. Further, a plurality of cracks each having a diameter of 150 μm were formed isotropically on the c-plane so as to extend from each modified portion. Thereafter, the focusing means was indexed by 150 μm to similarly form a plurality of continuous modified portions and cracks, thereby forming a separation layer at the depth of 100 μm, which corresponds to the thickness of a wafer to be produced. The overlap rate R can be calculated from the diameter D of each modified portion (D=17 μm in this test) and the spacing L of the adjacent focal points spaced in the feeding direction. The spacing L of the adjacent focal points spaced in the feeding direction is defined by the feed speed V (V=200 mm/second in this test) and the repetition frequency F of the pulsed laser beam (F=60 kHz in this test) as described above (L=V/F).

$$R = (D - L)/D$$
$$= \{D - (V/F)\}/D$$
$$= [17 \text{ (μm)} - \{200 \text{ (mm/s)}/60 \text{ (kHz)}\}]/17 \text{ (μm)}$$
$$= [17 \times 10^{-6} \text{ (m)} - \{200 \times 10^{-3} \text{ (m/s)}/60 \times 10^{3}(\text{Hz})\}]/17 \times 10 - 6 \text{ (m)}$$
$$= 0.8$$

(Test 2) Dependence on the Frequency of Ultrasonic Wave in Relation to the Natural Frequency The natural frequency of the single crystal SiC ingot having a thickness of 3 mm mentioned above was determined as 25 kHz. In Test 2, the single crystal SiC ingot in which the separation layer was formed in Test 1 was immersed in water having a temperature of 25° C. Further, the power of ultrasonic wave to be applied to the ingot was set to 100 W, and the frequency of the ultrasonic wave was changed in the sequence of 10 kHz, 15 kHz, 20 kHz, 23 kHz, 25 kHz, 27 kHz, 30 kHz, 40 kHz, 50 kHz, 100 kHz, 120 kHz, and 150 kHz. In this condition, the ultrasonic wave was applied to the ingot immersed in the water to thereby separate the wafer from the ingot along the separation layer as an interface. Then, the time required for the separation of the wafer at each frequency was measured to verify the frequency dependence.

(Result of Test 2)

| Frequency | Separation time |
|---|---|
| 10 kHz | Not separated even after 10 minutes elapsed: NG |
| 15 kHz | Not separated even after 10 minutes elapsed: NG |
| 20 kHz | Separated in 90 seconds |
| 23 kHz | Separated in 30 seconds |
| 25 kHz | Separated in 25 seconds |
| 27 kHz | Separated in 30 seconds |
| 30 kHz | Separated in 70 seconds |
| 40 kHz | Separated in 170 seconds |
| 50 kHz | Separated in 200 seconds |
| 100 kHz | Separated in 220 seconds |
| 120 kHz | Separated in 240 seconds |
| 150 kHz | Separated in 300 seconds |

(Test 3) Dependence on the Power of Ultrasonic Wwave

In Test 2, the power of the ultrasonic wave was fixed to 100 W and the frequency of the ultrasonic wave was changed to measure the time required for separation of the wafer from the ingot along the separation layer formed in Test 1. In contrast thereto, Test 3 was performed in the condition where the power of the ultrasonic wave was changed in the sequence of 200 W, 300 W, 400 W, and 500 W at each frequency used in Test 2 to measure the time required for separation of the wafer from the ingot along the separation layer formed in Test 1. Then, the power dependence was verified. The symbol "NG" depicted below is similar in meaning to that used in Result of Test 2. That is, the symbol "NG" means that the wafer was not separated from the ingot even after 10 minutes elapsed from the time of starting the application of the ultrasonic wave to the ingot.

(Result of Test 3)

| | Separation time at each power | | | |
|---|---|---|---|---|
| Frequency | 200 W | 300 W | 400 W | 500 W |
| 10 kHz | NG | NG | NG | NG |
| 15 kHz | NG | NG | NG | NG |
| 20 kHz | 50 sec | 33 sec | 15 sec | 6 sec |
| 23 kHz | 16 sec | 10 sec | 4 sec | 3 sec |
| 25 kHz | 3 sec | 1 sec | ≤1 sec | ≤1 sec |
| 27 kHz | 15 sec | 11 sec | 5 sec | 2 sec |
| 30 kHz | 48 sec | 40 sec | 18 sec | 3 sec |
| 40 kHz | 90 sec | 47 sec | 23 sec | 4 sec |
| 50 kHz | 100 sec | 58 sec | 24 sec | 6 sec |
| 100 kHz | 126 sec | 63 sec | 26 sec | 7 sec |
| 120 kHz | 150 sec | 70 sec | 27 sec | 8 sec |
| 150 kHz | 170 sec | 82 sec | 42 sec | 20 sec |

(Test 4) Temperature Dependence

In Test 4, the ingot in which the separation layer was formed in Test 1 was immersed in water, and the temperature of this water was increased from 0° C. to measure the time required for separation of the wafer from the ingot along the separation layer formed in Test 1. Then, the temperature dependence was verified. In Test 4, the frequency of the ultrasonic wave was set to 25 kHz and the power of the ultrasonic wave was set to 500 W.

(Result of Test 4)

| Temperature | Separation time |
|---|---|
| 0° C. | 0.07 sec |
| 5° C. | 0.09 sec |
| 10° C. | 0.12 sec |
| 15° C. | 0.6 sec |
| 20° C. | 0.8 sec |
| 25° C. | 0.9 sec |
| 30° C. | 3.7 sec |
| 35° C. | 4.2 sec |
| 40° C. | 6.1 sec |
| 45° C. | 7.1 sec |
| 50° C. | 8.2 sec |

From Result of Test 2, it was verified that the critical frequency of the ultrasonic wave for separation of the wafer from the ingot is dependent on the natural frequency of the ingot (25 kHz in this test) and that this critical frequency is 20 kHz close to the natural frequency of the ingot (this critical frequency is 0.8 times the natural frequency of the ingot). Further, it was also verified that when the frequency of the ultrasonic wave is in the range of 20 to 30 kHz in the vicinity of the natural frequency of the ingot (this frequency range is 0.8 to 1.5 times the natural frequency of the ingot), the wafer is separated from the ingot along the separation layer as an interface effectively (in a relatively short period of time). From Result of Test 3, it was verified that even when the frequency of the ultrasonic wave is greater than the frequency range of 20 to 30 kHz which is in the vicinity of the natural frequency of the ingot, the wafer is effectively separated from the ingot along the separation layer as an interface by increasing the power of the ultrasonic wave. From Result of Test 4, it was verified that when the temperature of the water as the liquid stored in the liquid bath of the separating apparatus is greater than 25° C., the energy of the ultrasonic wave is converted into cavitation, so that the wafer cannot be effectively separated from the ingot along the separation layer as an interface.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An SiC wafer producing method for producing an SiC wafer from a single crystal SiC ingot having an end surface, a c-axis intersecting said end surface, and a c-plane perpendicular to said c-axis, said SiC wafer producing method comprising:

a separation layer forming step of setting a focal point of a pulsed laser beam having a transmission wavelength to single crystal SiC inside said SiC ingot at a predetermined depth from said end surface, said predetermined depth corresponding to the thickness of said SiC wafer to be produced, and next applying said pulsed laser beam to said SiC ingot, thereby forming a plurality of modified portions on said c-plane at said predetermined depth and also forming a plurality of cracks isotropically formed on said c-plane so as to extend from each modified portion, each modified portion being a region where SiC has been decomposed into Si and C, said modified portions and said cracks constituting a separation layer along which said SiC wafer is to be separated from said SiC ingot; and a wafer producing step of separating a part of said SiC ingot along said separation layer as an interface, thereby producing said SiC wafer;

said wafer producing step including the steps of immersing said SiC ingot in a liquid and next applying ultrasonic wave through said liquid to said SiC ingot, said ultrasonic wave having a frequency greater than or equal to a critical frequency close to a natural frequency of said SiC ingot.

2. The SiC wafer producing method according to claim 1, wherein said critical frequency close to the natural frequency of said SiC ingot is 0.8 times the natural frequency of said SiC ingot.

3. The SiC wafer producing method according to claim 1, wherein said liquid is water, the temperature of said water being set to a temperature at which an occurrence of cavitation is suppressed.

4. The SiC wafer producing method according to claim 3, wherein the temperature of said water is in the range of 0° C. to 25° C.

5. The SiC wafer producing method according to claim 1, wherein said c-axis coincides with a normal to said end surface of said SiC ingot;

said separation layer forming step including:

a modified portion forming step of applying said pulsed laser beam to said SIC ingot in a condition where said focal point is set at said predetermined depth as relatively feeding said SiC ingot and said focal point in a feeding direction, thereby continuously forming said modified portions so that any adjacent ones of said modified portions overlap each other in said feeding direction; and an indexing step of relatively indexing said SiC ingot and said focal point in an indexing direction in the range not greater than the width of said cracks;

said modified portion forming step and said indexing step being alternately performed to form said separation layer, in which said cracks adjacent to each other in said indexing direction are connected.

6. The SiC wafer producing method according to claim 1, wherein said c-axis is inclined by an off angle with respect to a normal to said end surface of said SiC ingot;

said separation layer forming step including:

a modified portion forming step of applying said pulsed laser beam to said SiC ingot in a condition where said focal point is set at said predetermined depth as relatively feeding said SiC ingot and said focal point in a first direction perpendicular to a second direction where said off angle is formed between said c-plane and said end surface, thereby continuously forming said modified portions so that any adjacent ones of said modified portions overlap each other in said first direction; and an indexing step of relatively indexing said SiC ingot and said focal point in said second direction in the range not greater than the width of said cracks;

said modified portion forming step and said indexing step being alternately performed to form said separation layer, in which said cracks adjacent to each other in said indexing direction are connected.

* * * * *